(12) United States Patent
Mekhanik et al.

(10) Patent No.: US 8,982,617 B1
(45) Date of Patent: *Mar. 17, 2015

(54) BLOCK CLOSURE TECHNIQUES FOR A DATA STORAGE DEVICE

(71) Applicant: Sandisk Technologies Inc., Plano, TX (US)

(72) Inventors: Evgeny Mekhanik, Rehovot (IL); Arseniy Aharonov, Yessod Hamaala (IL)

(73) Assignee: Sandisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/286,501

(22) Filed: May 23, 2014

Related U.S. Application Data

(63) Continuation of application No. 14/080,626, filed on Nov. 14, 2013.

(51) Int. Cl.
*G11C 16/04* (2006.01)
*G11C 16/10* (2006.01)
*G11C 16/34* (2006.01)

(52) U.S. Cl.
CPC ............ *G11C 16/10* (2013.01); *G11C 16/0483* (2013.01); *G11C 16/3418* (2013.01)
USPC .................................. 365/185.02; 365/185.03

(58) Field of Classification Search
CPC .................. G11C 16/3418; G11C 16/0483
USPC .............. 365/185.02, 185.03, 185.11, 185.17
See application file for complete search history.

(56) References Cited

U.S. PATENT DOCUMENTS

| | | | |
|---|---|---|---|
| 7,554,848 B2 * | 6/2009 | Li et al. ..................... | 365/185.18 |
| 8,443,259 B2 * | 5/2013 | Thatcher et al. .............. | 714/763 |
| 2009/0070518 A1 | 3/2009 | Traister et al. | |
| 2009/0300425 A1 | 12/2009 | Gollub et al. | |
| 2010/0115325 A1 | 5/2010 | Lin | |
| 2010/0169547 A1 | 7/2010 | Ou | |
| 2010/0332894 A1 | 12/2010 | Bowers et al. | |
| 2011/0099460 A1 | 4/2011 | Dusija et al. | |
| 2011/0228604 A1 | 9/2011 | Eli et al. | |
| 2012/0102012 A1 | 4/2012 | Han et al. | |
| 2012/0226963 A1 | 9/2012 | Bivens et al. | |
| 2013/0097365 A1 | 4/2013 | Lee et al. | |

* cited by examiner

*Primary Examiner* — Vu Le
(74) *Attorney, Agent, or Firm* — Toler Law Group, PC

(57) ABSTRACT

A data storage device includes a controller and a non-volatile memory that includes a three-dimensional (3D) memory. A method includes initiating a write operation to write first data to a first word line of a multi-level cell (MLC) block of the non-volatile memory. The method further includes compensating, in response to an event that interrupts programming at the first word line, for incompletion of a write disturb effect at the MLC block due to the event by copying second data from a second word line of the MLC block to a second block of the non-volatile memory or by writing dummy data to the second word line.

20 Claims, 5 Drawing Sheets

204

| WL | LP | UP |
|---|---|---|
| 0 | 0 | 2 |
| 1 | 1 | 4 |
| 2 | 3 | 6 |
| 3 | 5 | 8 |
| 4 | 7 | 10 |
| 5 | 9 | 12 |
| 6 | 11 | (14) |

Example: in response to an event occurring while programming UP data to WL5, copy data from WL4, WL5, and WL6

208

| WL | LP | UP |
|---|---|---|
| 0 | 0 | 2 |
| 1 | 1 | 4 |
| 2 | 3 | 6 |
| 3 | 5 | 8 |
| 4 | 7 | (10) |
| 5 | 9 | (12) |
| 6 | (11) | (14) |

Example: in response to an event occurring while programming LP data to WL5, copy data from WL3, WL4, and WL5

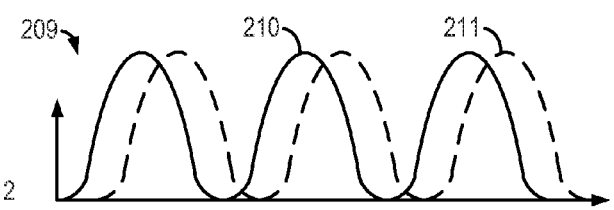

209    210    211

212

| WL | LP | UP |
|---|---|---|
| 0 | 0 | 2 |
| 1 | 1 | 4 |
| 2 | 3 | 6 |
| 3 | 5 | 8 |
| 4 | 7 | 10 |
| 5 | 9 | 12 |
| 6 | 11 | 14 |

Example: in response to an event occurring while programming LP data to WL5, re-write the LP data to WL5, write dummy LP data to WL6, and write dummy UP data to WL4, WL5, and WL6

216

| WL | LP | UP |
|---|---|---|
| 0 | 0 | 2 |
| 1 | 1 | 4 |
| 2 | 3 | 6 |
| 3 | 5 | 8 |
| 4 | 7 | 10 |
| 5 | 9 | 12 |
| 6 | (11) | (14) |

Example: in response to an event occurring after programming UP data to WL3, write dummy LP data to WL5 and write dummy UP data to WL4 and WL5

| P | - Fully-written page |
| /P/ | - Page with event |
| \|P\| | - Copied page |
| ⊠P⊠ | - Dummy page |
| (P) | - Unwritten page |

FIG. 2

BLOCK CLOSURE TECHNIQUES FOR A DATA STORAGE DEVICE

CROSS-REFERENCE TO RELATED APPLICATION

This application is a continuation of and claims priority to U.S. Non-Provisional patent application Ser. No. 14/080,626, filed Nov. 14, 2013, and is related to U.S. Non-Provisional patent application Ser. No. 14/080,655 filed Nov. 14, 2013. The contents of each of these applications are incorporated by reference herein in their entirety.

FIELD OF THE DISCLOSURE

The present application is generally related to data storage devices and more particularly to block closure techniques for data storage devices.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. As a result, flash memory devices may enable users to store and access a large amount of data.

Data stored at a flash memory data storage device may become less reliable over time. For example, a threshold voltage stored at a flash memory storage element may "shift" or lose charge over time due to charge leakage. The flash memory data storage device may track the length of time data has been stored at the flash memory storage element and may access the data in a manner determined by the length of time the data has been stored at the flash memory storage element. For example, if threshold voltages stored at the data storage device shift after a certain length of time, the data storage device may compensate for the shifting when accessing the data by adjusting one or more read thresholds used to sense the data.

SUMMARY

Techniques are disclosed for managing closure of multi-level cell (MLC) blocks in a data storage device, such as by maintaining a common set of parameters for a closed MLC block of the data storage device that is no longer available for write operations. For example, a block closure technique may enable a common set of cell voltage distribution (CVD) tracking parameters to be maintained for each word line of the closed MLC block storing valid data. The block closure technique may increase performance of the data storage device as compared to conventional devices in which word lines of a closed block are associated with multiple sets of CVD tracking parameters. For example, the block closure technique may enable a data storage device to access data at the closed MLC block using a common set of threshold voltages and/or a common set of error correcting code (ECC) control data instead of using multiple sets of threshold voltages and ECC control data. The data storage device may access data at each word line of the closed MLC block using the common set of threshold voltages instead of adjusting read circuitry to use different sets of threshold voltages to sense word lines of the closed MLC block. The data storage device may access data at each word line of the closed MLC block using the common set of ECC control data instead of re-calibrating an ECC decoder to use different ECC control data to decode data from word lines of the closed MLC block. Accessing data from each word line of the closed MLC block without re-adjusting the read circuitry and without re-adjusting the ECC decoder may reduce latency associated with read operations at the closed MLC block.

BRIEF DESCRIPTION OF THE DRAWINGS

FIG. 2 is a diagram illustrating certain example operations of the data storage device of FIG. 1;

DETAILED DESCRIPTION

Figure 1:
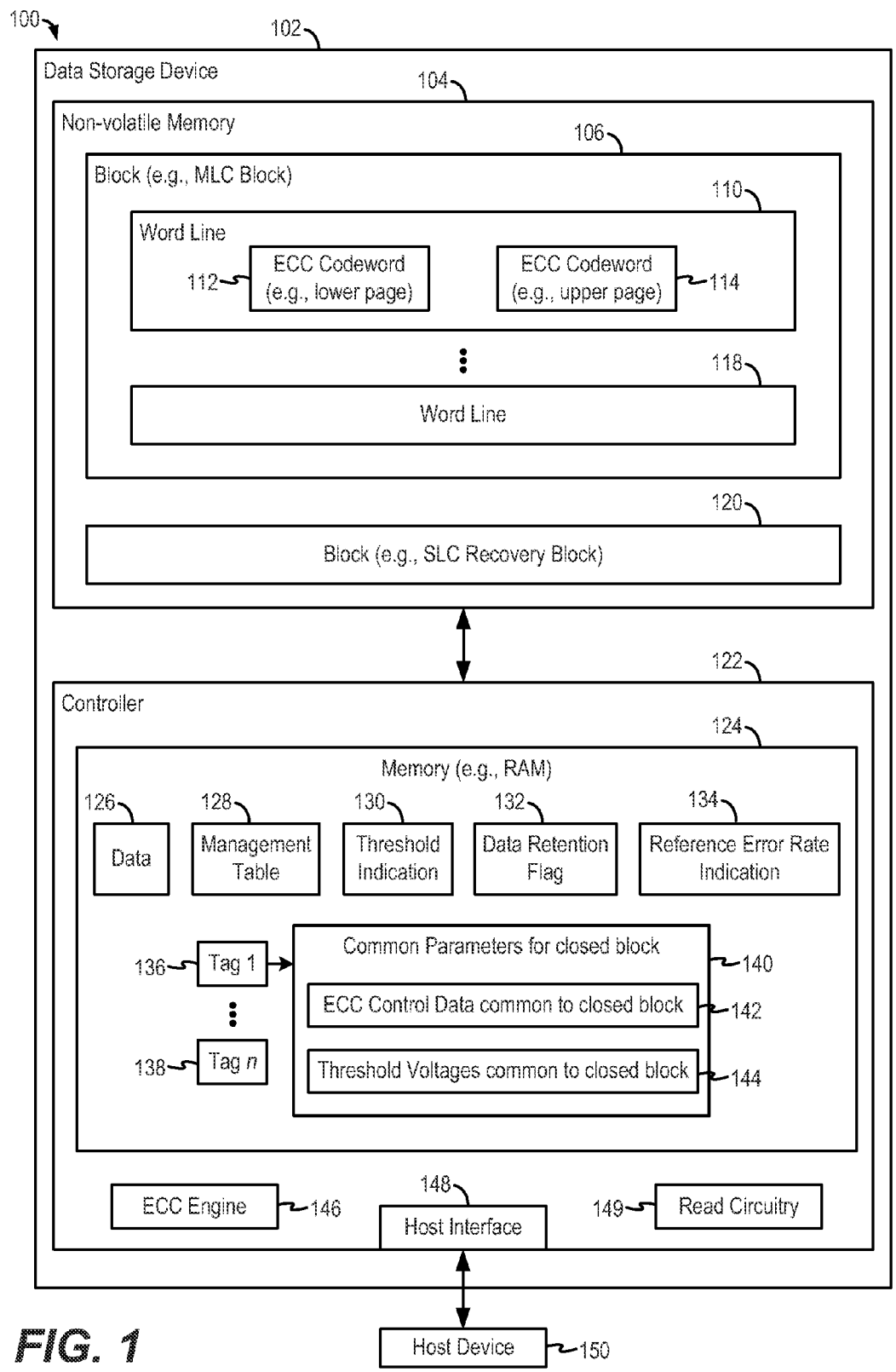
FIG. 1 is a block diagram of a particular illustrative embodiment of a system including a data storage device.

FIG. 1 is a block diagram of a particular illustrative embodiment of an electronic device 100 including a data storage device 102 and a host device 150. The data storage device 102 may be embedded within the host device 150, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 150. For example, the data storage device 102 may be removably coupled to the host device 150 in accordance with a removable universal serial bus (USB) configuration.

To further illustrate, the data storage device 102 may be configured to be coupled to the host device 150 as embedded memory, such as in connection with an eMMC configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a non-volatile memory 104 and a controller 122. In a particular illustrative embodiment, the non-volatile memory 104 may include a flash memory (e.g., a NAND flash memory or a NOR flash memory). In other implementations, the non-volatile memory 104 may include an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104 and the controller 122 may be coupled via a bus, an interface, another structure, or a combination thereof.

The non-volatile memory 104 may include multiple blocks of word lines (also referred to herein as "physical pages"). In the example of FIG. 1, the non-volatile memory 104 includes a block 106 and a block 120. In a particular embodiment, the block 106 is of a multi-level cell (MLC) configuration, and the block 120 is of a single-level cell (SLC) configuration. For example, the block 106 may include storage elements that are each configured to store any of three or more logical values, and the block 120 may include storage elements that are each configured to store either of two logical values (e.g., a logical "0" or a logical "1"). The block 120 may correspond to a recovery block that is reserved for data recovery at the data storage device 102.

The blocks 106, 120 may each include multiple word lines. In the example of FIG. 1, the block 106 includes a word line 110 and a word line 118. It should be appreciated that FIG. 1 is illustrative and that the data storage device 102 may include a different number and/or configuration of blocks and/or word lines. As described further below, the word lines 110, 118 may have a multi-level cell (MLC) configuration that enables each of the word lines 110, 118 to store multiple logical pages of data. To illustrate, if the word lines 110, 118 have a two-level ("X2") configuration, the word lines 110, 118 may each be configured to store two logical pages of data. As another example, if the word lines 110, 118 have a three-level ("X3") configuration, the word lines 110, 118 may each be configured to store three logical pages of data. Alternatively, one or both of the word lines 110, 118 may have another configuration.

In the example of FIG. 1, the word line 110 stores error correcting code (ECC) codewords 112, 114. The ECC codewords 112, 114 may correspond to logical pages that can be stored simultaneously at an MLC word line. As an example, the ECC codewords 112, 114 may respectively correspond to lower page data and upper page data, as described further below.

The controller 122 may include a memory 124, an error correcting code (ECC) engine 146, a host interface 148, and read circuitry 149. Although the example of FIG. 1 depicts the memory 124 as a single memory component, it should be appreciated that the memory 124 may correspond to multiple distinct memory components and/or multiple different types of memory components. For example, all or part of the memory 124 may correspond to a random access memory (RAM). As another example, a portion of the memory 124 may correspond to a high-speed cache that is configured to store one or more control parameters, as described further below. All or part of the memory 124 may correspond to another type of memory, such as a non-volatile memory included in the controller 122.

The host device 150 may correspond to a mobile telephone, a music player, a video player, a gaming console, an electronic book reader, a personal digital assistant (PDA), a computer, such as a laptop computer, tablet, or notebook computer, another electronic device, or a combination thereof. The host device 150 may communicate via a host controller, which may enable the host device 150 to read data from the non-volatile memory 104 and to write data to the non-volatile memory 104. The host device 150 may operate in compliance with a JEDEC Solid State Technology Association industry specification, such as an embedded MultiMedia Card (eMMC) specification or a Universal Flash Storage (UFS) Host Controller Interface specification. The host device 150 may operate in compliance with one or more other specifications, such as a Secure Digital (SD) Host Controller specification as an illustrative example. The host device 150 may communicate with the non-volatile memory 104 in accordance with another suitable communication protocol.

In operation, the controller 122 may receive data and instructions from the host device 150 and may send data to the host device 150. The controller 122 may send data and commands to the non-volatile memory 104 and may receive data from the non-volatile memory 104. As a particular example, the controller 122 may receive data 126 from the host device 150 via the host interface 148. The controller 122 may store (e.g., buffer) the data 126 at the memory 124. The data 126 may correspond to user data (e.g., a file or a portion of a file) that is to be stored at the non-volatile memory 104.

The ECC engine 146 may be configured to receive the data 126 and to generate a codeword based on the data 126. For example, the ECC engine 146 may include an encoder configured to encode the data 126 using an ECC encoding technique. The ECC engine 146 may include a Reed-Solomon encoder, a Bose-Chaudhuri-Hocquenghem (BCH) encoder, a low-density parity check (LDPC) encoder, a turbo encoder, an encoder configured to encode the data 126 according to one or more other ECC techniques, or a combination thereof. The ECC engine 146 may include a decoder configured to decode data read from the non-volatile memory 104 to detect and correct, up to an error correction capability of an ECC technique used by the ECC engine 146, bit errors that may be present in the data. As a particular example, the ECC engine 146 may receive the data 126 from the memory 124. The ECC engine 146 may generate one or more ECC codewords based on the data 126. For example, the ECC engine 146 may generate the ECC codewords 112, 114 based on the data 126.

The controller 122 is configured to send data and a write command to cause the non-volatile memory 104 to store the data to a specified address of the non-volatile memory 104. As a particular example, the controller 122 may send the ECC codewords 112, 114 to the non-volatile memory 104. The example of FIG. 1 indicates that the controller 122 may write the ECC codewords 112, 114 at the word line 110 of the non-volatile memory 104.

The controller 122 is configured to send a read command to read data from a specified address of the non-volatile memory 104. As an example, the controller 122 may send a read command to sense threshold voltages stored at the word line 110. The read circuitry 149 may compare the sensed threshold voltages to reference voltage levels (e.g., read thresholds) to generate the ECC codewords 112, 114. The ECC engine 146 may be configured to receive the ECC codewords 112, 114 (e.g., upon a sense operation by the controller 122 to sense the ECC codewords 112, 114 from the non-volatile memory 104) and to decode the ECC codewords 112, 114 to generate the data 126 (or a portion thereof).

A write operation at the non-volatile memory 104 may be interrupted by an event. To illustrate, if the controller 122 initiates a write operation to write one of the ECC codewords 112, 114 at the non-volatile memory 104 but the write operation is "interrupted" or "stalled" due to an event (e.g., a power-down event), then the non-volatile memory 104 stores "partially-written" data. As an example, if the controller 122 initiates writing the ECC codeword 112 to the word line 110 and a power down event occurs while writing the ECC codeword 112 to the word line 110, then the non-volatile memory 104 may store a portion of the ECC codeword 112. As another example, if a power-down event occurs after the controller 122 completes writing the ECC codeword 112 to the word line 110 and while the ECC codeword 114 is being written to the word line 110, then the non-volatile memory 104 may store a portion of the ECC codeword 114. In such cases, the word line 110 may store "partially-written" data.

A block closure technique in accordance with the present disclosure may close the block 106 in response to a word line of the block 106 storing partially-written data (e.g., in response to an event causing one of the ECC codewords 112, 114 to be partially-written to the word line 110). Closing the block 106 may include inhibiting further write operations to the block 106 by the controller 122 (and by the host device 150). For example, the controller 122 may be configured to update a management table 128 to indicate that the block 106 is unavailable for write operations, such as updating the management table 128 to indicate that the block 106 does not include a word line having an address that may be targeted by a subsequent write operation.

The block closure technique may copy data from word lines of the block 106 affected by the event. As a particular illustrative example, if a write abort event occurs while writing data (e.g., one of the ECC codewords 112, 114) at the word line 110, the ECC codewords 112, 114 may be copied to another portion of the non-volatile memory 104, such as to the block 120.

The controller 122 may be configured to update the management table 128 to indicate that the ECC codewords 112, 114 have been copied to the block 120. The management table 128 may include a file allocation table (FAT). The management table 128 may be further updated to indicate that the data stored at the word line 110 has been invalided and/or that the data stored at the block 120 is valid.

Data of one or more other word lines of the block 106 likely to be affected by the write abort event (or "indirectly affected" by the write abort event) may be copied to the block 120. As a particular example, if the word line 118 is adjacent to the word line 110, data stored at the word line 118 may also be affected by the write abort event, as described further with reference to FIG. 2. Data from the word line 118 may be copied to the block 120, and the block 106 may be closed to further write operations. According to further examples, dummy data (e.g., invalid data) may be written to the block 106 to adjust threshold voltages stored at the word line 110 (e.g., via a write disturb effect), as described further with reference to FIG. 2.

Closing the block 106 in accordance with the block closure technique may enable common parameters 140 to be used to read from the block 106 data written prior to the write abort event. To illustrate, in certain conventional devices, data written at a block before a write abort event and data written at the block after the write abort event may be associated with different parameters, such as different cell voltage distribution (CVD) tracking parameters indicated by different time tags. By closing the block 106 in response to the write abort event, writing of "new" data after the write abort event may be avoided, thus enabling use of the common parameters 140 to read data from the block 106.

The common parameters 140 may include CVD tracking parameters that are common to each word line of the block 106. The common parameters 140 may indicate ECC control data 142 that is common to the block 106. For example, the ECC control data 142 may indicate a type of encoding technique used to encode data stored at the block 106. The common parameters 140 may indicate threshold voltages 144 common to the block 106. For example, as data is retained at the block 106, threshold voltages of storage elements of the block 106 may "drift" (e.g., due to charge leakage). The threshold voltages 144 may indicate suitable threshold voltages for reading data stored at the block 106. Further, a common time tag, such as a time tag 136, may be associated with the common parameters 140 (instead of multiple time tags, such as the time tag 136 and a time tag 138).

The block closure technique described with reference to FIG. 1 may enable improved efficiency and operation of the data storage device 102. For example, by associating the time tag 136 with the common parameters 140 for the block 106, operation of the data storage device 102 is simplified compared to conventional devices that access multiple time tags and/or multiple sets of parameters to sense and/or decode data from a block. To illustrate, by using the threshold voltages 144 that are common to the block 106, the controller 122 may sense each word line of the block 106 that stores valid data without re-adjusting the read circuitry 149 based on multiple sets of threshold voltages (e.g., without re-configuring the read circuitry 149 from a first set of threshold voltages used to sense the word line 110 to a second set of threshold voltages used to sense the word line 118). By using the ECC control data 142 that is common to the block 106, the controller 122 may sense each word line of the block 106 that stores valid data without re-adjusting the ECC engine 146 based on multiple sets of ECC parameters (e.g., without re-configuring the ECC engine 146 from a first set of ECC parameters used to decode data sensed from the word line 110 to a second set of ECC parameters used to decode data sensed from the word line 118). Accessing data from each word line of the block 106 that stores valid data without re-adjusting the read circuitry 149 and without re-adjusting the ECC engine 146 may reduce latency associated with read operations at the block 106.

Further, the common parameters 140 may be stored at a high-speed cache portion of the memory 124 and used to sense and/or decode data from each word line of the block 106 that stores valid data. Because the high-speed cache portion may be associated with high production cost and/or large device area, caching multiple sets of read thresholds and multiple sets of ECC parameters for each block of the non-volatile memory 104 may be infeasible or may consume cache area reserved for other information. Thus, conventional devices may store multiple sets of read thresholds and multiple sets of ECC parameters at a location other than a high-speed cache portion (e.g., a portion associated with lower production cost and/or device size). Because the common parameters 140 may include a single set of threshold voltages and a single set of ECC parameters, the common parameters 140 may be stored at the high-speed cache portion, thus improving performance of the data storage device 102, such as by reducing latency associated with read operations.

Alternatively or in addition to triggering the block closure technique in response to a write abort event, the controller 122 may be configured to trigger the block closure technique in connection with a data retention detection technique implemented by the controller 122. To illustrate, in a particular embodiment, the controller 122 is configured to select a "reference word line" of a block of the non-volatile memory 104. The controller 122 may be configured to use the reference word line to estimate data retention of the block (e.g., ability of the block to retain data without a large amount of errors). The controller 122 may close the block in response to determining that the data retention of the block is below a threshold data retention.

As an illustrative example, the controller 122 may select the word line 118 as the reference word line. In a particular embodiment, the word line 118 is a "middle" word line of the block 106. For example, if the block 106 includes a positive integer number L of word lines and if the word line 118 is the (L/2)th word line of the block 106, the controller 122 may select the word line 118 as the reference word line.

Upon selecting the word line 118 as the reference word line, the controller 122 may store a reference error rate indication 134 at the memory 124. The reference error rate indication 134 may indicate a first error rate associated with data stored at the word line 118 at a first time. For example, the reference error rate indication 134 may indicate a decoded error rate and/or a bare estimation bit error rate (BER) associated with the data at a particular time. To illustrate, the controller 122 may estimate the bare estimation BER by determining a likely number of bit errors of the data without decoding through the errors to determine an actual error rate (e.g., decoded error rate) of the data. For example, in ECC configurations in which a "hard" number of bit errors can be determined by the controller 122 only upon decoding the data, the bare estimation BER may correspond to a "soft" number of bit errors of the data (e.g., an estimated number of bit errors estimated by the controller 122).

Although the example of FIG. 1 depicts that the reference error rate indication 134 is stored at the memory 124 of the controller 122, the reference error rate indication 134 (and/or other data stored at the memory 124) may be stored at the non-volatile memory 104 alternatively or in addition to being stored at the memory 124. For example, the reference error rate indication 134 may be copied from the memory 124 to the non-volatile memory 104 prior to a power-down event at the data storage device 102. In a particular embodiment, the ECC engine 146 is configured to determine error rates of data stored at the non-volatile memory 104, such as the first error rate.

After a power-up event at the data storage device 102, the controller 122 may sense data from the word line 118 and may determine a second error rate associated with the data sensed from the word line 118. The controller 122 may determine a difference between the second error rate and the first error rate indicated by the reference error rate indication 134. The controller 122 may compare the difference to a data retention threshold indicated by a threshold indication 130. If the controller 122 determines that the difference satisfies (e.g., is greater than or equal to) the data retention threshold indicated by the threshold indication 130, the controller 122 may update the reference error rate indication 134 to indicate the second error rate.

If the controller 122 determines that the difference does not satisfy (e.g., is less than) the data retention threshold indicated by the threshold indication 130, the controller 122 may trigger the block closure technique. As a particular example, the controller 122 may set (e.g., assert) a data retention flag 132. The data retention flag 132 may indicate that open blocks of the non-volatile memory 104 are to be closed. The open blocks may include the block 106, the block 120, one or more other blocks of the non-volatile memory 104, or a combination thereof.

Setting the data retention flag 132 may trigger the block closure technique described above. For example, the controller 122 may be configured to check the data retention flag 132 in response to each power-up event at the data storage device 102. If the data retention flag 132 is asserted, the controller 122 may close one or more open blocks of the non-volatile memory 104 in accordance with the block closure technique. For example, data from a partially-written word line may be copied to a recovery block that is reserved for data recovery, and data stored at a second word line that may be affected by write operations at the partially-written word line may also be copied to the recovery block, as described further with reference to FIG. 2.

The data retention detection technique described with reference to FIG. 1 may enable improved performance of the data storage device 102. For example, by closing a block to write operations once data retention of the block is less than an acceptable threshold, data loss can be avoided (or reduced). In particular, data can be read and copied from the block before data retention at the block is low enough to cause bit errors that prevent successful sensing and/or decoding of the data. In a particular illustrative embodiment, the data retention detection technique triggers closure of a block when a particular measured error rate associated with the block increases by 25 percent or more. The data retention detection technique may be applied during assembly of the electronic device 100, such as during an infrared reflow (IR) operation, as described further with reference to FIG. 5.

FIG. 2 is a diagram illustrating certain example operations of the data storage device 102 of FIG. 1. FIG. 2 depicts operation states 204, 208, 212, and 216. Each of the operation states 204, 208, 212, and 216 indicates states of word lines (WL) 0, 1, 2, 3, 4, 5, and 6. The word lines 0-6 may correspond to word lines of a block of the non-volatile memory 104. For convenience of description, the word lines 0-6 are described as being included in the block 106, though it should be appreciated that the word lines 0-6 may be included in another block of the non-volatile memory 104 (e.g., the block 120, or another block of the non-volatile memory 104).

Each of the word lines 0-6 may be programmed to store a lower page and an upper page. For example, a lower page and an upper page may correspond to the ECC codewords 112, 114, respectively. In the example of FIG. 2, numerals included in the lower page (LP) column and the upper page (UP) column indicate an order of write operations at the block 106. For example, referring to the operation state 204, a lower page may be written to the word line 0 (indicated by "0" in the LP column), followed by a lower page written to the word line 1 (indicated by "1" in the LP column), followed by an upper page written to the word line 0 (indicated by "2" in the UP column), followed by a lower page written to the word line 2 (indicated by "3" in the LP column), etc. In FIG. 2, numerals in parentheses indicate pages that are scheduled to be written but have not yet been written (e.g., due to interruption of a write process).

In the operation state 204, the word lines 0, 1, 2, 3, and 4 each store a lower page and an upper page. The word lines 5 and 6 each store a lower page. An event may occur at the data storage device 102 while writing an upper page to the word line 5. The event may cause a write abort at the word line 5. The event may interrupt or stall writing the upper page to the word line 5. For example, the event may include a power-down event, a power droop event, a power drop event, a program failure event, a sanitization event (e.g., receiving an eMMC sanitize command from the host device 150 by the controller 122), or receiving by the controller 122 a host command from the host device 150 to close one or more open blocks of the non-volatile memory 104 (e.g., an eMMC halt command), as illustrative examples.

Because the word lines 4 and 6 are adjacent to the word line 5, the event may affect data written at the word lines 4 and 6 in addition to affecting data (e.g., the lower page) stored at the word line 5. As an example, in some configurations, data may be written to the word lines 4 and 6 assuming that writing the upper page at the word line 5 will affect the data stored at the word lines 4 and 6, such as by affecting threshold voltages of storage elements of the word lines 4 and 6 via a write disturb effect, such as a cross-coupling effect or a "Yupin effect." Certain conventional devices may create multiple sets of read parameters for word lines in response to such an event. For example, a conventional technique may associate a first set of read parameters with the word lines 0, 1, 2, and 3 and a second set of read parameters with the word lines 4 and 6 (e.g., in order to compensate for incompletion of the write disturb effect on the word lines 4 and 6 that would occur if the writing of the upper page were completed at the word line 5).

As used herein, the word line 5 may be "directly" affected by an event that interrupts programming at the word line 5, and the word lines 4, 6 may be "indirectly" affected by the event. For example, the word line 4 may be indirectly affected by the event because the lower page stored at the word line 4 is not affected by a complete write disturb effect that would result from completing writing of the lower page at the word line 5. As another example, the word line 6 may be indirectly affected by the event because the event interrupts writing of the upper page to the word line 5, resulting in incompletion of the write disturb effect at the word line 6. As used herein, a "critical region" includes any word lines directly affected or indirectly affected by an event that interrupts writing of data at the non-volatile memory 104.

To further illustrate, FIG. 2 depicts a histogram 209 that includes a set 210 of threshold voltages and a set 211 of threshold voltages. The sets 210, 211 may each correspond to a group of threshold voltage distributions stored at a word line of the non-volatile memory 104 (e.g., an "A" state distribution, a "B" state distribution, and a "C" state distribution). The set 211 includes greater threshold voltages due to completion of a write disturb effect as compared to the set 210. In a particular example, the set 211 corresponds to threshold voltages stored at the word line 2 in the operation state 204, and the set 210 corresponds to threshold voltages stored at the word line 3 in the operation state 204.

To compensate for incompletion of the write disturb effect at the word line 3 (e.g., to compensate for the set 210 including lower threshold voltages than the set 211), the controller 122 may copy data from the word lines 4, 5, and 6 to the block 120. The block 120 may correspond to a recovery block (e.g., an SLC recovery block) of the non-volatile memory 104. In the particular example of FIG. 2, lower pages of the word lines 4, 5, and 6 and upper pages of the word lines 4 and 5 may be copied to the block 120. The upper page of word line 5 may be copied from the word line 5 (if recoverable), or from a data buffer of the controller 122. Upon copying the data to the block 120, the block 106 may be closed to further write operations.

As a result of closing the block 106, data stored at the word lines 0, 1, 2, and 3 may be associated with a common time tag indicating common parameters for reading data from the word lines 0, 1, 2, and 3. For example, subsequent write operations to the block 106 may be inhibited by closing the block 106, thus avoiding association of another time tag with the block 106 that would occur upon storing of data at the block 106 at a subsequent time. The common time tag may correspond to the time tag 136, and the common parameters may correspond to the common parameters 140. In response to closing the block 106, the management table 128 may be updated to indicate memory locations of the copied data at the non-volatile memory 104 (e.g., memory locations of the block 120). The controller 122 may update the management table 128 to indicate that the word lines 4, 5, and 6 store invalid data and/or that the block 120 stores valid data.

In the operation state 208, the word lines 0, 1, 2, and 3 each store a lower page and an upper page. The word line 4 stores a lower page. An event may occur at the data storage device 102 while programming a lower page to the word line 5. The event may interrupt or stall writing of the lower page to the word line 5. For example, the event may include a power-down event, a power droop event, a power drop event, a program failure event, a sanitization event (e.g., receiving an eMMC sanitize command from the host device 150 by the controller 122), or receiving by the controller 122 a host command from the host device 150 to close one or more open blocks of the non-volatile memory 104 (e.g., an eMMC halt command), as illustrative examples.

In response to the event, the controller 122 may copy data from the word lines 3, 4, and 5 to the block 120. For example, because the word line 4 is adjacent to the word line 5, the lower page stored at the word line 4 may be affected by the event due to incompletion of a write disturb effect that would occur if programming at the word line 5 were completed. The operation state 208 further indicates that an upper page is scheduled to be written to the word line 4 after writing the lower page to the word line 5. Accordingly, because the word line 3 is adjacent to the word line 4, data stored at the word line 3 may be affected by the event due to incompletion of a write disturb effect that would occur if the upper page were programmed at the word line 4 (after successfully completing programming of the lower page at the word line 5).

Upon copying data from the word lines 3, 4, and 5 to the block 120, the block 106 may be closed to further write operations. In response to closing the block 106, the controller 122 may update the management table 128 to indicate memory locations of the copied data at the non-volatile memory 104 (e.g., memory locations of the block 120). The controller 122 may update the management table 128 to indicate that the word lines 3, 4, and 5 store invalid data and/or that the block 120 stores valid data.

In the operation state 212, the word lines 0, 1, 2, 3, and 4 each store a lower page. The word lines 0, 1, 2, and 3 each store an upper page. An event may occur at the data storage device 102 while programming a lower page to the word line 5. The event may interrupt or stall writing of the lower page to the word line 5. For example, the event may include a power-down event, a power droop event, a power drop event, a program failure event, a sanitization event (e.g., receiving an eMMC sanitize command from the host device 150 by the controller 122), or receiving by the controller 122 a host command from the host device 150 to close one or more open blocks of the non-volatile memory 104 (e.g., an eMMC halt command), as illustrative examples. At the time the event occurs, the word line 4 may be partially-written (e.g., may store a lower page but not an upper page) and the word line 6 may be unwritten (e.g., does not store a lower page or an upper page).

In response to the event, the controller 122 may re-write the lower page to the word line 5 and may write dummy data (e.g., invalid data, such as a sequence of random or pseudo-random bits) to the word lines 4, 5, and 6. The dummy data written to the word lines 4, 5, and 6 may include a dummy lower page written to the word line 6 and dummy upper pages written to the word lines 4, 5, and 6, as illustrated. The controller 122 may close the block 106 to further write operations. The controller 122 may update the management table 128 to indicate that the word lines 4, 5, and 6 store invalid data. For example, the controller 122 may update the management table 128 to indicate that the word lines 4 and 5 each store a valid lower page, the word line 6 stores an invalid lower page (i.e., dummy data), and the word lines 4, 5, and 6 each store invalid upper pages (i.e., dummy data).

The dummy data written to the word lines 4, 5, and 6 may compensate for incompletion of a write disturb effect caused by interruption of writing of data at the word line 5. For example, writing the dummy upper page to the word line 4 may increase threshold voltages stored at the word line 3 via the write disturb effect, since the word line 3 is adjacent to the word line 4.

In the operation state 216, the word lines 0, 1, 2, and 3 each store a lower page and an upper page. The word line 4 stores a lower page. In the particular example of the operation state 216, the upper page of the word line 3 corresponds to a "last written" page, and an event occurs at the data storage device 102 after completing writing the upper page to the word line 3 but prior to writing a lower page to the word line 5. The event may include a sanitization event (e.g., receiving an eMMC sanitize command from the host device 150 by the controller 122) or receiving by the controller 122 a host command from the host device 150 to close one or more open blocks of the non-volatile memory 104 (e.g., an eMMC halt command), as illustrative examples.

In response to the event, the controller 122 may write a dummy lower page to the word line 5 and dummy upper pages to the word lines 4 and 5. The controller 122 may close the block 106 to further write operations. The controller 122 may update the management table 128 to indicate that the word lines 4, 5, and 6 store invalid data. For example, the controller 122 may update the management table 128 to indicate that the word lines 4 and 5 each store an invalid upper page (i.e., dummy data) and that the word line 5 further stores an invalid lower page.

The examples described with reference to FIG. 2 illustrate block closure techniques that enable improved operation of a data storage device. For example, the block closure techniques of FIG. 2 enable each word line of the block 106 storing valid data to be associated with a common time tag. That is, instead of resuming an interrupted write operation after an event (e.g., after a power cycle) and then assigning distinct time tags to data written before and after the event, the controller 122 may close the block 106, enabling use of a common time tag for each word line of the block 106 storing valid data. Accordingly, subsequent write operations to the block 106 may be inhibited by closing the block 106, thus avoiding association of another time tag with the block 106 that would occur upon storing of data at the block 106 at a subsequent time. Use of a common time tag for each word line of the block 106 storing valid data may improve operation of a data storage device by enabling use of the common parameters 140 for the block 106, such the ECC control data 142 and/or the threshold voltages 144. Using the common parameters 140 may avoid re-adjustment of the read circuitry 149 and the ECC engine 146 in order to access data stored at different word lines of the block 106.

Figure 3:
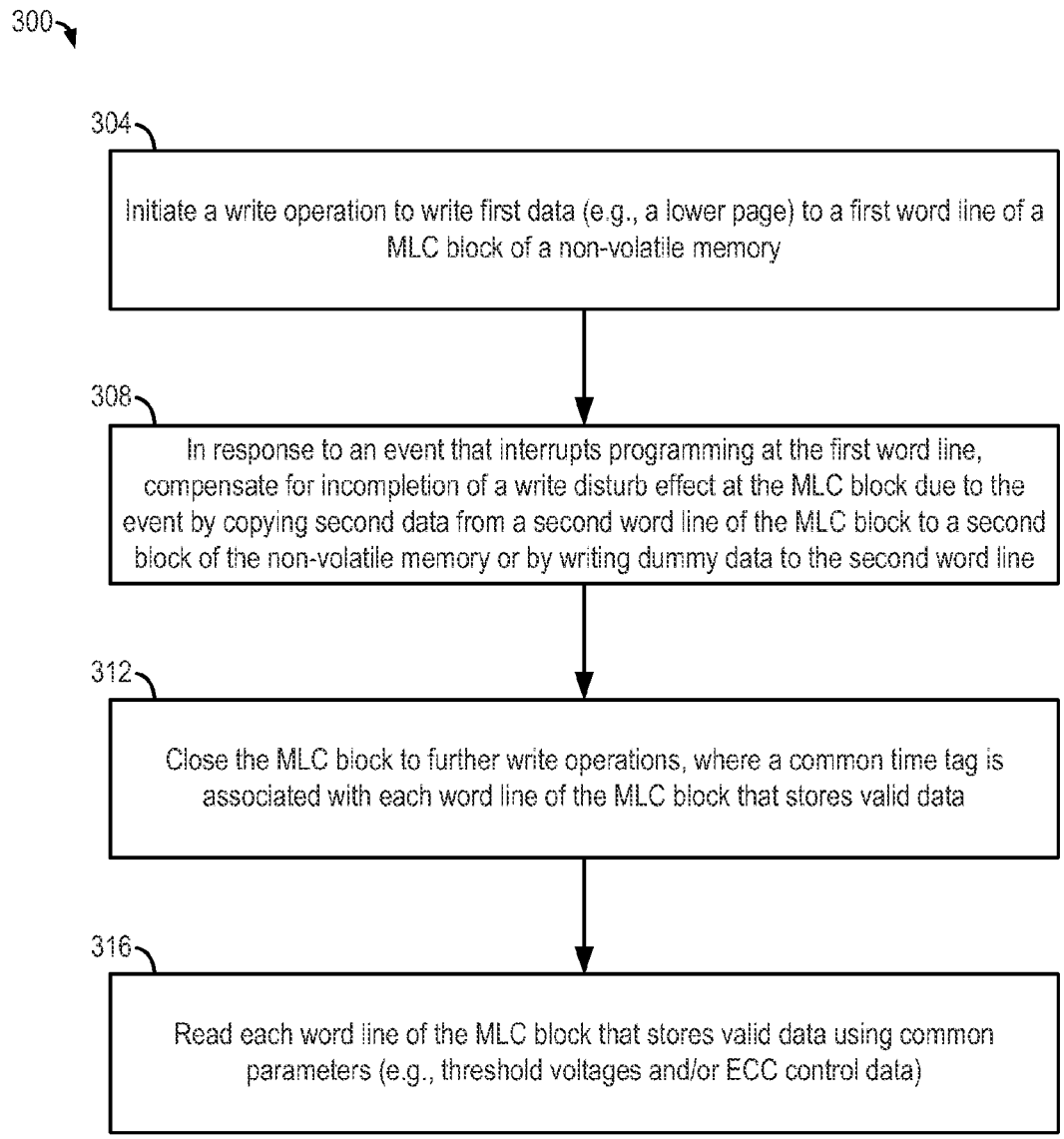
FIG. 3 is a flow diagram of a particular illustrative embodiment of a method of operation of the data storage device of FIG. 1.

Referring to FIG. 3, a particular illustrative embodiment of a method is depicted and generally designated 300. The method 300 may be performed in the data storage device 102, such as by the controller 122.

The method 300 may include initiating a write operation to write first data to a first word line of a multi-level cell (MLC) block of a non-volatile memory, such as the non-volatile memory 104, at 304. The MLC block may correspond to the block 106. The word line may correspond to any of the word lines described with reference to FIGS. 1 and 2, such as the word line 110. The first data may correspond to the ECC codeword 112 and/or to a lower page, such as one of the lower pages described with reference to FIG. 2.

The method 300 may further include compensating for incompletion of a write disturb effect at the MLC block in response to an event that interrupts programming at the first word line, at 308. Compensating for incompletion of the write disturb effect includes copying second data from a second word line of the MLC block to a second block of the non-volatile memory 104 (e.g., from the word line 118 to the block 120) or writing dummy data to the second word line (e.g., writing invalid data to the word line 118). The event may correspond to any of the events described with reference to FIG. 2. The second word line may be configured to be disturbed by data writes to the first word line via the write disturb effect, such as to adjust voltage thresholds at the second word line to correspond to the set 211 (e.g., to "shift" the voltage thresholds from the set 210 to the set 211).

As an example, referring to the operation state 204, if the event occurs while programming an upper page at the word line 5, compensating for incompletion of the write disturb effect may include copying data from the word lines 4, 5, and 6 to a second block of the non-volatile memory 104. For example, the controller 122 may copy lower pages from the word lines 4, 5, and 6 and upper pages from the word lines 4 and 5 to the block 120. In this case, the second word line may correspond to the word line 4 and/or to the word line 6 (each of which are adjacent to the word line 5).

As another example, referring to the operation state 208, if the event occurs while programming a lower page at the word line 5, compensating for incompletion of the write disturb effect may include copying data from the word lines 3, 4, and 5 to a second block of the non-volatile memory 104. For example, the controller 122 may copy lower pages from the word lines 3, 4, and 5 and an upper page from the word line 3 to the block 120. In this case, the second word line may correspond to the word line 3 and/or to the word line 4. The word line 4 is adjacent to the word line 3 and to the word line 5. That is, the word line 4 is between the word lines 3, 5.

As another example, referring to the operation state 212, if the event occurs while programming a lower page at the word line 5, compensating for incompletion of the write disturb effect may include writing dummy data to the word lines 4, 5, and 6. For example, the controller 122 may re-write the lower page to the word line 5 and may write dummy upper pages to the word lines 4, 5, and 6 and a dummy lower page to the word line 6. The dummy pages may correspond to invalid data, and the management table 128 may indicate that the dummy pages are invalid. In this case, the second word line may correspond to the word line 4 and/or the word line 6. The word lines 4, 6 are each adjacent to the word line 5.

As another example, referring to the operation state 216, if the event occurs after programming an upper page at the word line 3 and prior to programming a lower page at the word line 5, compensating for incompletion of the write disturb effect may include writing dummy data to the word lines 4 and 5. For example, the controller 122 may write a dummy lower page to the word line 5 and dummy upper pages to the word lines 4 and 5. In this case, the second word line may correspond to the word line 5. The word line 5 is adjacent to the word line 4.

The method 300 may further include closing the MLC block to further write operations, at 312. A common time tag may be associated with each word line of the MLC block that stores valid data. The common time tag may correspond to the time tag 136. The common time tag may enable reading of data from each word line of the MLC block storing valid data using a common set of parameters. For example, the method 300 may further include reading each word line of the MLC block that stores valid data using common parameters, at 316. The common parameters may correspond to the common parameters 140. The common parameters may include the ECC control data 142, the threshold voltages 144, or a combination thereof.

By compensating for incompletion of the write disturb effect, word lines of the MLC block storing valid data may be accessed using the common parameters instead of separately treating word lines affected and not affected by incompletion of the write disturb effect. To illustrate, in the examples described with reference to FIG. 3, word lines storing threshold voltages corresponding to the set 210 may be data-copied to the block 120 or may be programmed with dummy data. Accordingly, each word line of the MLC block storing valid data may be programmed to store data that is illustrated by the set 211. In this manner, each word line of the MLC block storing valid data may be read using common read threshold voltages and/or common ECC control data, which may avoid accessing multiple sets of read threshold voltages and/or multiple sets of ECC control data, simplifying operation of a data storage device. Accordingly, the method 300 illustrates example block closure techniques that enable improved operation of a data storage device.

The block closure techniques illustrated with reference to FIG. 3 may be used in connection with a data retention detection technique. For example, a data retention detection technique may correspond to one or more of the events described with reference to FIG. 3 and may trigger the block closure technique of FIG. 3. In a particular embodiment, the controller 122 triggers the block closure technique of FIG. 3 in response to determining that a data retention status of the non-volatile memory 104 is below a threshold data retention, as described further with reference to FIG. 4.

Figure 4:
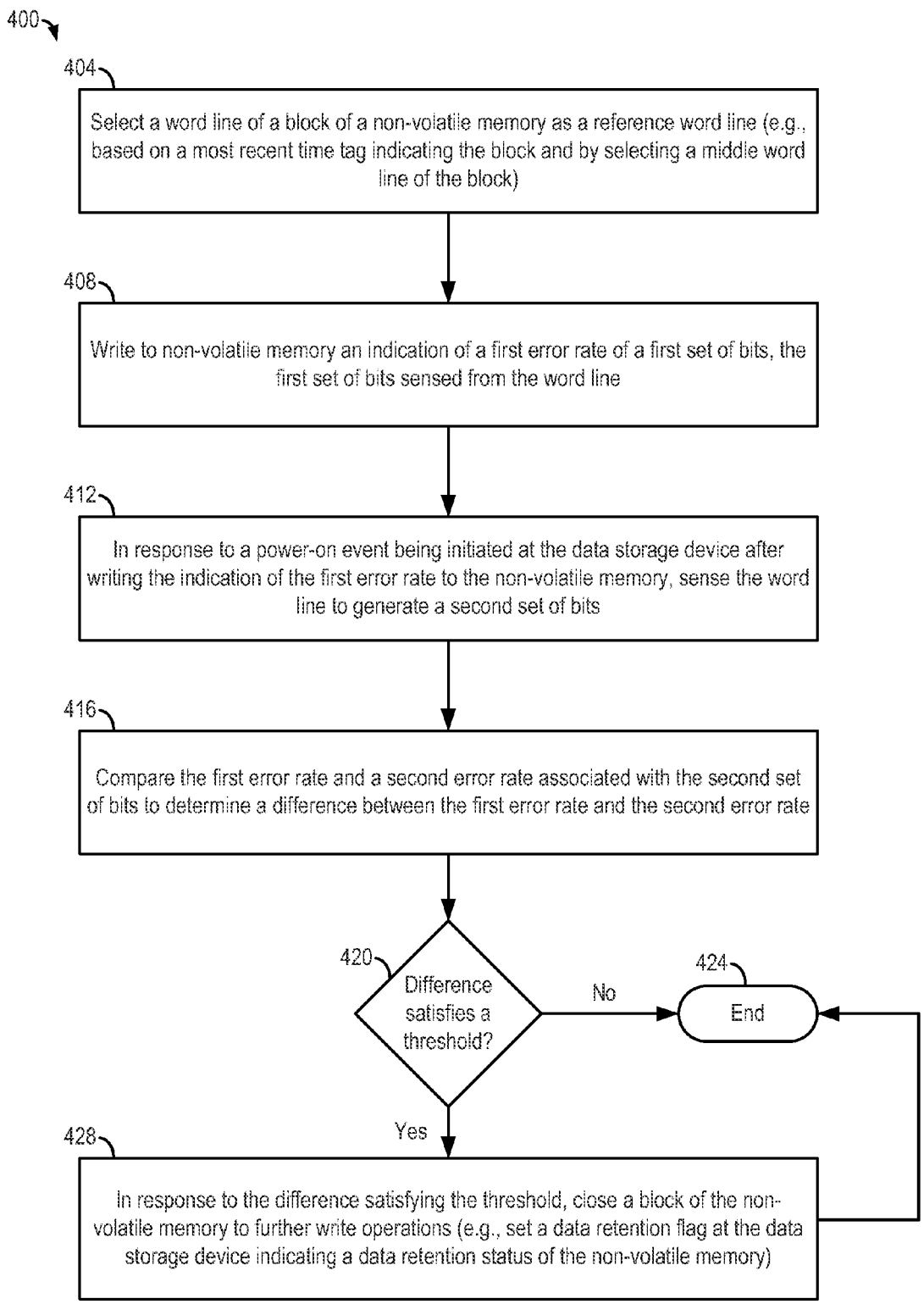
FIG. 4 is a flow diagram of another particular illustrative embodiment of a method of operation of the data storage device of FIG. 1.

Referring to FIG. 4, a particular illustrative embodiment of a method is depicted and generally designated 400. The method 400 may be performed in the data storage device 102, such as by the controller 122.

The method 400 may include selecting a word line of a block of a non-volatile memory, such as the non-volatile memory 104, as a reference word line, at 404. As a particular example, the controller 122 may determine a most recently accessed time tag of the data storage device 102 and may select a block associated with the time tag (e.g., by accessing the memory 124 to determine a most recently created time tag or a most recently accessed time tag). The block may correspond to the block 106, and the time tag may correspond to one of the time tags 136, 138. The controller 122 may select a middle word line of the block as the reference word line. For example, if the block includes a positive integer number L of word lines, the controller 122 may select the (L/2)th word line as the reference word line. The reference word line may be included in a closed block of the non-volatile memory 104 (e.g., a block of the non-volatile memory 104 where no further data writes by the controller 122 are scheduled or expected).

The method 400 may further include writing to the non-volatile memory 104 an indication of a first error rate of a first set of bits sensed from the word line, at 408. For example, if the controller 122 selects the word line 110 as the reference word line, the controller 122 may sense a set of bits from the word line 110 (e.g., one or both of the ECC codewords 112, 114) and determine an error rate associated with the set of bits. The set of bits may include a predefined bit pattern that the controller 122 can check for bit errors. The set of bits may correspond to a reference page, such as a reference upper page, programmed to the reference word line. The controller 122 may store an indication of the error rate anywhere at the non-volatile memory 104 (e.g., at the block 106, at the block 120, or at another block of the non-volatile memory 104). The indication may correspond to the reference error rate indication 134.

The error rate of the first set of bits may be determined according to a suitable technique. According to a first technique, the first error rate is a bit error rate (BER) indicating a percentage of bit errors associated with the set of bits. For example, the first error rate may be a "bare" BER that is determined by the controller 122 prior to (or without) the ECC engine 146 decoding the set of bits. For example, if the set of bits is a predefined bit pattern, the controller 122 may determine a number of bits of the set of bits that differs from the predefined bit pattern. Alternatively, the error rate can be determined in connection with a decoding operation performed by the ECC engine 146, such as by determining a number of bits that are corrected while decoding the set of bits.

The method 400 may further include sensing the word line to generate a second set of bits, at 412. The word line may be sensed in response to a power-on event being initiated at the data storage device 102 and after writing the indication of the first error rate to the non-volatile memory 104. The second set of bits may differ from the first set of bits due to one or more bit errors. The second set of bits may be generated independently of a host command from the host device 150 to read data from the word line. For example, the data storage device 102 may be configured to sense the word line in response to each power-on event detected at the data storage device 102.

The method 400 may further include comparing the first error rate (e.g., by accessing the indication of the first error rate) and a second error rate associated with the second set of bits to determine a difference between the first error rate and the second error rate, at 416. The second error rate may be determined in a manner illustrated by any of the examples described with reference to the first error rate. As a particular example, the second error rate may correspond to a bare estimation BER.

The method 400 may include determining whether the difference satisfies a threshold, at 420. For example, the controller 122 may compare the difference to a data retention threshold indicated by the threshold indication 130. In a particular illustrative embodiment, the threshold is satisfied when the second error rate exceeds the first error rate by 25 percent or more. Alternatively, the threshold may be a different number, depending on the particular application (e.g., depending on an error correction capability of the ECC engine 146).

If the difference does not satisfy the threshold (e.g., if the difference is less than the data retention threshold), the method 400 may terminate, at 424. For example, one or more open blocks of the non-volatile memory 104 may remain open if the difference does not satisfy the threshold. If the difference satisfies the threshold (e.g., if the difference is greater than or equal to the data retention threshold), the method 400 includes closing a block of the non-volatile memory 104 (e.g., any of the blocks 106, 120) to further write operations, at 428. The block may be closed in a manner illustrated by the block closure technique described with reference to FIG. 3.

In a particular illustrative embodiment, closing the block includes setting (e.g., asserting) a data retention flag, such as the data retention flag 132. Setting the data retention flag may cause the controller 122 to close one or more (e.g., all) open blocks of the non-volatile memory 104. As an example, the controller 122 may be configured to check the data retention flag 132 in response to each power-up event at the data storage device 102. If the controller 122 determines (e.g., after a second power-up event) that the data retention flag 132 is asserted, the controller 122 may close one or more open blocks of the non-volatile memory 104 to write operations after the second power-up event.

The open blocks may be closed using one or more operations described with reference to FIGS. 2 and 3. For example, a "critical region" of an open block may be data-copied to a second block of the non-volatile memory 104 or written with dummy data, as described with reference to FIGS. 2 and 3.

The method 400 of FIG. 4 illustrates a data retention detection technique that may reduce or prevent data corruption and improve performance at the data storage device 102. For example, by closing one or more open blocks of the non-volatile memory 104 based on the data retention status of the non-volatile memory 104, such as when a difference between the first error rate and the second error rate satisfies a threshold, "stress" effects on the one or more open blocks (e.g., due to repetitive programming and erasure) can be managed before data at the one or more open blocks becomes unrecoverable (e.g., un-decodable by the ECC engine 146). Further, by closing a block of the non-volatile memory 104 based on the data retention status, a common time tag may be associated each word line of the block storing valid data (instead of writing additional data to the block and associating the additional data with another time tag), which may avoid accessing multiple sets of read threshold voltages and/or multiple sets of ECC control data, simplifying operation of the data storage device 102. Further, by selecting a representative page stored at a representative word line of a block (e.g., a representative upper page stored at a middle word line of a block), the data retention detection technique of FIG. 4 may be applied "system-wide," instead of repeating a data retention operation on a block-by-block basis for each block of the non-volatile memory 104.

The data retention detection technique illustrated with reference to FIG. 4 may be utilized during operation of the data storage device 102. Alternatively or in addition, the data retention detection technique of FIG. 4 may be used in connection with a production process associated with the data storage device 102. As an example, the data retention detection technique may be utilized in connection with an infrared (IR) reflow process that attaches the non-volatile memory 104 and/or the controller 122 to a printed circuit board (PCB) (or to another component) during an assembly process. For example, the data storage device 102 may be soldered to a PCB of the host device 150 during assembly of the host device 150 and in connection with an embedded configuration of the data storage device 102. In a particular embodiment, the data retention detection technique is used to determine that the IR reflow process is completed and that data stored at the non-volatile memory 104 should be copied from an SLC memory portion of the non-volatile memory 104 to an MLC memory portion of the non-volatile memory 104, as described further with reference to FIG. 5. The IR reflow detection technique illustrated with reference to FIG. 5 may be used in connection with the data retention detection technique of FIG. 4.

Figure 5:
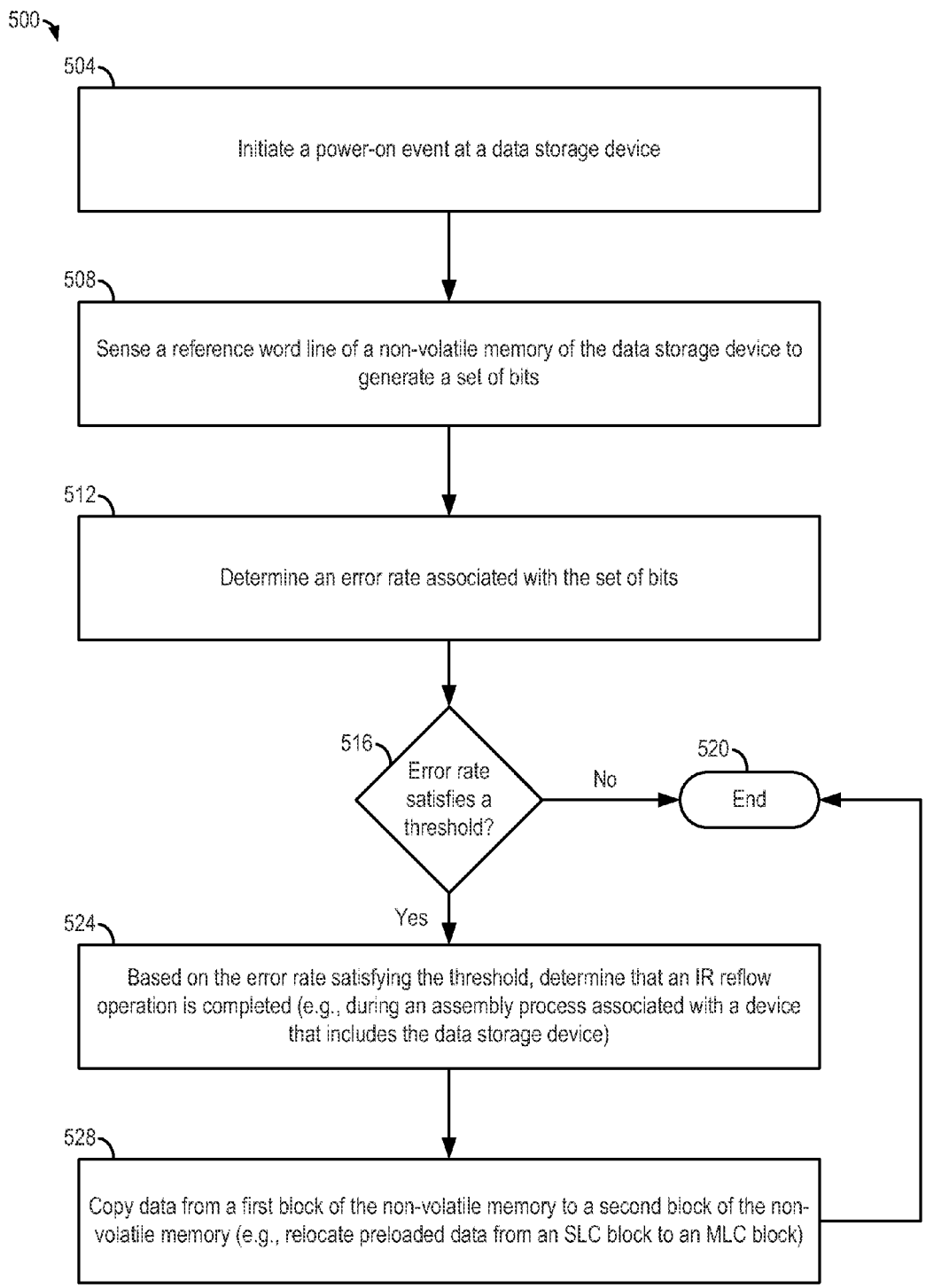
FIG. 5 is a flow diagram of another particular illustrative embodiment of a method of operation of the data storage device of FIG. 1.

Referring to FIG. 5, a particular illustrative embodiment of a method is depicted and generally designated 500. The method 500 may be performed in the data storage device 102, such as by the controller 122. In a particular embodiment, the method 500 is performed during assembly of the host device 150 (e.g., while the data storage device 102 is being embedded within the host device 150).

The method 500 may include initiating a power-on event at the data storage device 102, at 504. The power-on event may occur during an assembly process associated with the host device 150, such as during an assembly process that embeds components within the host device 150.

The method 500 may further include sensing a reference word line of a non-volatile memory of the data storage device 102, such as the non-volatile memory 104, to generate a set of bits, at 508. The reference word line may be the reference word line described with reference to FIG. 4. For example, the reference word line may be a middle word line of an MLC block of the non-volatile memory 104. The set of bits may include a predefined bit pattern that the controller 122 can check for bit errors. In a particular embodiment, the set of bits is programmed to the data storage device 102 by a manufacturer of the data storage device 102. The set of bits may correspond to a reference page, such as a reference upper page, programmed to the reference word line.

The method 500 may further include determining an error rate associated with the set of bits, at 512. The error rate may be determined according to one or more of the techniques described with reference to FIG. 4. For example, the error rate may indicate a bare BER of the set of bits.

The method 500 may include determining whether the error rate satisfies a threshold, at 516. In a particular embodiment, the error rate of FIG. 5 corresponds to the second error rate described with reference to FIG. 4. For example, the controller 122 may compare the error rate of FIG. 5 with the first error rate of FIG. 4 to determine a difference, and to determine whether the difference satisfies the threshold, as described with reference to FIG. 4. In other embodiments, the controller 122 may be configured to compare the error rate of FIG. 5 to the threshold to determine whether the error rate satisfies the threshold.

If the error rate fails to satisfy the threshold, the method 500 may terminate, at 520. For example, a determination may be made that the IR reflow operation is not completed. Upon completion of the IR reflow operation, data that is pre-loaded to the non-volatile memory 104 may be relocated from an SLC portion of the non-volatile memory 104 to an MLC portion of the non-volatile memory 104.

To illustrate, data may be pre-loaded to the non-volatile memory 104 prior to the data storage device 102 being integrated within an electronic device, such as prior to embedding the data storage device 102 within the host device 150 (in connection with an illustrative embedded configuration). Such "preloaded" data may be subject to one or more corrupting events that may cause errors to occur in the data. In some circumstances, a number of errors introduced in the preloaded data may exceed an error correction capability of an ECC technique used by the ECC engine 146 to protect the preloaded data. To illustrate, attaching a first die that includes the non-volatile memory 104 to a PCB or to a second die that includes the controller 122 may heat the first die. Heating the first die may cause threshold voltage shifting of storage elements that store the preloaded data, causing errors in the preloaded data. To improve data integrity, the preloaded data may be stored at an SLC portion of the non-volatile memory 104 during the IR reflow process and copied to an MLC portion of the non-volatile memory 104 after the IR reflow process is completed.

The method 500 may further include determining that the IR reflow operation is completed based on the error rate satisfying the threshold, at 524. For example, the error rate may be sufficient to cause threshold voltage shifting of storage elements that store the preloaded data, causing errors in the preloaded data. In the example of FIG. 5, the errors may be utilized to determine that the IR reflow operation is completed.

The method 500 may further include copying data from a first block of the non-volatile memory 104 to a second block of the non-volatile memory 104, such as to relocate the preloaded data in response to determining that the IR reflow operation is completed, at 528. The first block and the second block may correspond to SLC and MLC blocks of the non-volatile memory 104, respectively. In a particular illustrative example, the first block and the second block respectively correspond to the blocks 120, 106, and preloaded data is copied from the block 120 to the block 106. The second block may include the reference word line, or the second block may correspond to another block of the non-volatile memory 104.

The method 500 illustrates an IR reflow detection technique that may reduce time and cost associated with production of an electronic device that includes the data storage device 102. For example, customers may charge certain production time to suppliers of data storage devices, and manually instructing each data storage device to relocate pre-loaded data after assembly would consume time and resources. Accordingly, by configuring the data storage device 102 to relocate pre-loaded data in response to "recognizing" that an IR reflow operation is completed, production time and expense can be reduced.

One or more techniques described herein may be applicable to data storage devices that include multiple memory dies. To illustrate, the non-volatile memory 104 may correspond to a first memory die of the data storage device 102, and the data storage device 102 may further include a second memory die including a second non-volatile memory (not shown in FIG. 1). In a particular embodiment, the controller 122 implements the data retention detection technique illustrated with reference to FIG. 4 for each memory die of the data storage device 102 (e.g., for the first memory die and for the second memory die). That is, the controller 122 may utilize a first reference portion (e.g., page, word line, or block) of the first memory die to determine a data retention status of the first memory die, and the controller 122 may utilize a second reference portion (e.g., page, word line, or block) of the second memory die to determine a data retention status of the second memory die. The controller 122 may be configured to assert multiple data retention flags to indicate respective data retention statuses of the multiple memory dies. Those of skill in the art will recognize that one or more other techniques described herein may be applicable to multi-die devices.

Although certain operations are described herein separately for convenience of illustration, one of skill in the art will appreciate that such operations can be selectively applied (e.g., combined) depending on the particular application. To illustrate, in a particular embodiment, one or more techniques described herein may be applied during production of the electronic device 100 and during operation of the electronic device 100. For example, the IR reflow detection technique illustrated in connection with the method 500 and the data retention detection technique described with reference to the method 400 may be utilized during production of the electronic device 100. Alternatively or in addition, the data retention detection technique described with reference to the method 400 and the block closure technique described in accordance with the method 300 may be used during operation of the electronic device 100. Those of skill in the art will recognize that further applications of the techniques described herein are within the scope of the disclosure.

Although one or more components described herein are illustrated as block components and described in general terms, such components may include one or more microprocessors, state machines, or other circuits configured to enable the controller 122 (or one or more components thereof) to perform operations described herein. For example, one or more components described herein may correspond to one or more physical components, such as hardware controllers, state machines, logic circuits, one or more other structures, or a combination thereof, to enable the controller 122 to perform one or more operations described herein. One or more aspects of the controller 122 may be implemented using a microprocessor or microcontroller programmed to perform operations described herein, such as one or more operations of the methods 300, 400, and 500. In a particular embodiment, the controller 122 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, the controller 122 may be configured to initiate a write operation to write first data to a first word line of an MLC block of the non-volatile memory 104, such as by issuing a write command to the non-volatile memory 104 that targets (e.g., identifies within an operand of the write command) an address of the first word line. An event may interrupt programming at the first word line. For example, one or more commands may be received by the controller 122 from the host device 150 via the host interface 148 instructing the data storage device 102 to close one or more open blocks of the non-volatile memory 104. The controller 122 may execute one or more instructions to respond to such commands from the host device 150.

As another example, a power detector circuit of the data storage device 102 may be configured to detect a power down event, a power droop event, a power drop event, or a combination thereof. In response to the event, the controller 122 may compensate for incompletion of a write disturb effect at the MLC block due to the event by copying second data from a second word line of the MLC block to a second block of the non-volatile memory (e.g., by issuing one or more sense commands to the non-volatile memory 104 targeting an address of the MLC block and by issuing one or more write commands to the non-volatile memory 104 targeting an address of the second block). The controller 122 may compensate for incompletion of the write disturb effect by writing dummy data to the second word line (e.g., by generating random or pseudo-random data by a pseudo-random number generator of the data storage device 102 to generate the dummy data and by issuing the dummy data and a write command targeting the MLC block to the non-volatile memory 104).

To further illustrate, the controller 122 may be configured to write an indication of a first error rate of a first set of bits to the non-volatile memory 104 (e.g., using a write command targeting an address of the non-volatile memory 104). The first set of bits is sensed from a word line of the non-volatile memory (e.g., using a sense command targeting an address of the word line). In response to a first power-on event being initiated at the data storage device after writing the indication of the first error rate to the non-volatile memory, the controller 122 may sense the word line to generate a second set of bits, such as by issuing to the non-volatile memory 104 a sense command targeting the address of the word line. The controller 122 may determine whether a difference between the first error rate and a second error rate associated with the second set of bits satisfies a threshold, such as by executing a compare instruction. In response to the difference satisfying the threshold, the controller 122 may set a data retention flag, such as by issuing a write command to the non-volatile memory 104 to copy the data retention flag 132 from the memory 124 to the non-volatile memory 104 (e.g., to assert the data retention flag 132). The data retention flag indicates a data retention status of the non-volatile memory.

In a particular embodiment, the data storage device 102 may be attached to or embedded within one or more host devices, such as within a housing of a host communication device, which may correspond to the host device 150. For example, the data storage device 102 may be integrated within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 150. In a particular embodiment, the data storage device 102 may include a non-volatile memory, such as a three-dimensional (3D) memory, a flash memory (e.g., a NAND memory, a NOR memory, an MLC flash memory, a divided bit-line NOR (DINOR) memory, an AND memory, a high capacitive coupling ratio (HiCR) device, an asymmetrical contactless transistor (ACT) device, or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a controller and a non-volatile memory that includes a three-dimensional (3D) memory, the data storage device including circuitry associated with operation of memory cells of the 3D memory, performing by the controller:
   initiating a write operation to write first data to a first word line of a multi-level cell (MLC) block of the non-volatile memory; and
   in response to an event that interrupts programming at the first word line, compensating for incompletion of a write disturb effect at the MLC block due to the event by copying second data from a second word line of the MLC block to a second block of the non-volatile memory or by writing dummy data to the second word line.

2. The method of claim 1, further comprising closing the MLC block to further write operations after compensating for incompletion of the write disturb effect.

3. The method of claim 1, further comprising maintaining at least one common parameter that is common to each word line of the MLC block that stores valid data after compensating for incompletion of the write disturb effect.

4. The method of claim 3, wherein the at least one common parameter indicates threshold voltages used to read data from each word line of the MLC block that stores valid data.

5. The method of claim 3, wherein the at least one common parameter indicates error correcting code (ECC) control data used by an ECC engine of the controller to decode data from each word line of the MLC block storing valid data.

6. The method of claim 3, wherein the at least one common parameter is a time tag.

7. The method of claim 1, wherein the first data corresponds to a lower page, wherein the event occurs while writing the lower page to the first word line, and wherein the second word line is adjacent to the first word line.

8. The method of claim 1, wherein the first data corresponds to an upper page, wherein the event occurs while writing the upper page to the first word line, and wherein a third word line of the MLC block is between the first word line and the second word line.

9. The method of claim 1, wherein the second block is a single-level cell (SLC) block.

10. The method of claim 1, wherein the event includes one or more of a power-down event, a power droop event, a program failure event, a sanitization event, or receiving a host command to close one or more open blocks of the non-volatile memory.

11. A data storage device comprising:
   a non-volatile memory that includes a three-dimensional (3D) memory, the non-volatile memory including a multi-level cell (MLC) block and a second block, wherein the MLC block includes a first word line and a second word line; and
   a controller coupled to the non-volatile memory, wherein the controller includes circuitry associated with operation of memory cells of the 3D memory and is configured to initiate a write operation to write first data to the first word line and to compensate, in response to an event that interrupts programming at the first word line, for incompletion of a write disturb effect at the MLC block due to the event by copying second data from the second word line to the second block or by writing dummy data to the second word line.

12. The data storage device of claim 11, wherein the controller is further configured to close the MLC block to further write operations after compensating for incompletion of the write disturb effect.

13. The data storage device of claim 11, wherein the second word line is adjacent to the first word line.

14. The data storage device of claim 11, wherein the MLC block further includes a third word line, and wherein the third word line is between the first word line and the second word line.

15. The data storage device of claim 14, wherein the third word line is adjacent to the first word line.

16. The data storage device of claim 11, wherein the second word line is configured to be disturbed by data writes to the first word line via the write disturb effect.

17. The data storage device of claim 11, wherein the controller is further configured to operate according to a block closure technique that causes the controller to close the MLC block to write operations after compensating for incompletion of the write disturb effect.

18. The data storage device of claim 17, wherein the controller is further configured to maintain at least one common parameter that is common to each word line of the MLC block that stores valid data after closing the MLC block.

19. The data storage device of claim 11, wherein the second block is a recovery block reserved for data recovery.

20. The data storage device of claim 11, wherein the second block is a single-level cell (SLC) block.

* * * * *